United States Patent
Kitamura et al.

(10) Patent No.: US 6,791,439 B2
(45) Date of Patent: Sep. 14, 2004

(54) CONNECTION STRUCTURE FOR HIGH-FREQUENCY CIRCUIT SUBSTRATE, MANUFACTURING METHOD THEREOF AND HIGH FREQUENCY CIRCUIT DEVICE

(75) Inventors: Yoichi Kitamura, Tokyo (JP); Yukihiro Tahara, Tokyo (JP); Akira Tsumura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/408,236

(22) Filed: Apr. 8, 2003

(65) Prior Publication Data

US 2004/0080386 A1 Apr. 29, 2004

(30) Foreign Application Priority Data

Oct. 29, 2002 (JP) ........................................ 2002-314505

(51) Int. Cl.[7] ................................................ H01P 1/00
(52) U.S. Cl. ........................................ 333/247; 257/664
(58) Field of Search ................................ 333/246, 247, 333/238; 257/664–666, 728

(56) References Cited

U.S. PATENT DOCUMENTS 6,483,406 B1 * 11/2002 Sawa et al. ................. 333/247

2003/0030516 A1 * 2/2003 Tsukiyama et al. ......... 333/247

FOREIGN PATENT DOCUMENTS

| JP | 7-240601 | 9/1995 | |
| JP | 9-148524 | 6/1997 | |
| JP | 411345910 A | * 12/1999 | ........... H01L/23/12 |

* cited by examiner

Primary Examiner—Timothy P. Callahan
Assistant Examiner—Cassandra Cox
(74) Attorney, Agent, or Firm—Burns, Doane, Swecker & Mathis, L.L.P.

(57) ABSTRACT

A connection structure is provided, which can perform an electrical connection between high-frequency circuit substrates in a manner of high workability and productivity. A connection structure comprises: a high-frequency transmission line lead frame connecting a first high-frequency transmission line formed on a first high-frequency circuit substrate to a second high-frequency transmission line formed on a second high-frequency circuit substrate; a plurality of GND electrode lead frames disposed in parallel to the high-frequency transmission line lead frame on both sides thereof, and providing a connection between a first GND electrode of the first high-frequency circuit substrate and a second GND electrode of the second high-frequency circuit substrate; and a reinforcing substrate integrally securing the high-frequency transmission line lead frame and a plurality of GND electrode lead frames.

13 Claims, 10 Drawing Sheets

CONNECTION STRUCTURE FOR HIGH-FREQUENCY CIRCUIT SUBSTRATE, MANUFACTURING METHOD THEREOF AND HIGH FREQUENCY CIRCUIT DEVICE

BACKGROUND OF THE INVENTION

1. Field of Invention

The present invention relates to a connection structure providing an electrical connection between substrates of high-frequency circuit substrates in which high-frequency electronic components are packaged in a high-frequency electronic device processing a high-frequency signal such as microwave, millimeter wave or the like. The invention also relates to a method for manufacturing the mentioned connection structure and to a high-frequency circuit device constructed of the high-frequency circuit substrate and the connection structure.

2. Description of the Related Art

It is an essential requirement that electronic circuit such as commercial communication apparatus, satellite, radar, etc., which are used in a high-frequency radio frequency band of, e.g., X band (5.2–10.9 GHz) and K band (10.9–36.0 GHz), are low in loss and high in reliability.

Particularly, as a high-frequency circuit substrate packaged with high-frequency electronic components, a ceramic substrate of a low dielectric loss and a printed wiring board made of a fluorocarbon resin or BT (bismaleimid triazine) resin have been commonly utilized.

As to a high-frequency circuit substrate packaged with high-frequency electronic components, it is often the case that a plurality of high-frequency circuit substrates are connected and used for reasons of design or circuit assembly.

When connecting such high-frequency circuits to each other, connection with the use of a connector and cable is carried out commonly and generally in order to maintain the above-mentioned low loss and high reliability.

However, a connection structure using the connector and cable brings about the following problems.

A problem exists in that a machining cost becomes exceedingly high as well as downsizing is not easy since a connector consisting of a large number of precision components is manufactured by machining.

Another problem exists in that use of cables causes bulky connection portions, or incapability of weight saving.

Therefore, a connection method without use of any connector and cable has been devised for the purpose of achieving reduction in cost and size.

Connection between the high-frequency circuit substrates is not achieved just by connecting the substrates to each other through a conductor. A further problem exists in that sufficient electrical characteristic cannot be achieved without obtaining matching in the light of a high-frequency circuit.

Consequently, a still further problem exists in that a low-cost connection method used in a low-frequency circuit cannot be applied to the connection of a high-frequency circuit as it is.

On the other side, a further problem exists in that a long-term reliability cannot be preserved without absorbing or diminishing in any way a mechanical stress (i.e., heat stress) that is applied to a connection portion due to difference in linear expansion coefficient of the substrate or in connection structure due to change in ambient temperature.

An attempt for providing a connection between the substrates while satisfying electric characteristic and reliability has been proposed in the form of a connection structure, for example, in a patent document 1 (the Japanese Patent Publication (unexamined) No. 240601/1995.

As described in the above-mentioned patent document 1, this attempt is a method for implementing connection between two high-frequency circuit substrates, which are packaged onto a metal base, with the use of a connecting conductor molded in a semicircular shape.

To satisfy the electric characteristic, various types of conductors are devised.

That is, to deal with an impedance mismatch at a connection portion, a conductor for connection is formed into a plate shape, and conforms to a micro strip line in width.

Furthermore, a semicircular connection conductor 4 is packaged with a convex portion thereof facing to a metal base so as to be close to ground thereby causing an impedance mismatch to be smaller.

A heat stress generated at the connection portion due to temperature change and difference in linear expansion coefficient between the substrate and the connection conductor is to be absorbed or diminished by forming a connection conductor into a semicircular shape.

Meanwhile, the connection conductor, which is a single metal strip as shown in the patent document 1, is hard to be handled.

Although depending on conditions at the time of designing a circuit, the connection conductor becomes a minute part, which is several dozen to several hundred μm square, thereby making it hard to handle.

For the same reason, operations for positioning and accurately packaging the connection conductor at a predetermined place on a high-frequency circuit substrate come to be extremely difficult.

Electrically, in the case where structure of the high-frequency transmission line is designed as a micro strip line, connection can be performed only with one part (connection conductor). For applying the connection conductor to a coplanar transmission line, however, three parts have to be used.

In addition, a coplanar transmission line is a type of transmission line processing a high-frequency signal, that is, a form in which ground potential parts (GND electrodes) are disposed adjacent on both sides of the high-frequency signal line.

Accordingly, to provide a connection between the substrates of the coplanar transmission line, required are one connection conductor acting as a connection conductor for mutually connecting the high-frequency signal lines and two connection conductors for connecting together the ground potential parts (GND electrodes) located on both sides of the high-frequency signal line.

It is extremely difficult to package a large number of such separate minute parts (i.e., connection conductors) close to one another.

Particularly in the case of joining them by soldering, e.g., movement of parts due to surface tension at the time of solder fusion should be taken into consideration.

Furthermore, in terms of function to absorb or diminish a heat stress, a semicircular connection conductor cannot be used in the case where interval between the substrates is narrow since the connection conductor is constructed so as to absorb or diminish a stress, which is applied to a connection portion, at a semicircular portion thereof.

Likewise, in the case where the substrate is thin, and distance between the micro strip line on the upper surface of the substrate and the metal base is small, a semicircular height portion of the connection conductor comes to be an obstacle without any sufficient level difference, thereby making it hard to package the semicircular connection conductor.

Furthermore, the packaging employs a method of connecting the substrates at the end portions thereof, and therefore it is necessary to form a transmission line such as micro strip line possessing high dimension accuracy up to the end portion of the substrate.

To realize this, routing is required since an inexpensive substrate machining such as punching, which renders poor finish accuracy at the end portion of the substrate.

When machining with a router the substrate on which a conductor resides up to the end portion, a copper foil at the machined portion may be turned up thereby making it difficult to secure accuracy at the end portion.

In addition, routing is a type of machining with the use of a NC (numerical control) router machine, which is a method for machining an article to be processed by feeding a rotating tool provided with spiral blades to the article.

Therefore, it is certainly possible to process an article with high accuracy even if it is of a complicated configuration. But there is a disadvantage of high machining cost since an expensive working machine is used.

Further, in the high-frequency circuit substrate that is a component of the high-frequency device, deformation such as warp, torsion or wave often occurs depending on manufacturing conditions or production lot regardless of an organic material or inorganic material. Such occurrence of deformation is a difference from the case where a high-frequency circuit substrate is made of a metallic material.

Furthermore, it is often the case that adjacent substrates are not in the same thickness due to a subtle difference in finish thereof or requirement for performing an impedance matching. There may be an occasion that a level difference of not less than several hundred $\mu$m is produced between the substrates.

As a result, in the conventional example as shown in the patent document 1, there may be a case where an electrical conduction cannot be obtained (open state) between the substrates in certain packaging conditions.

For example, when sucking a connection conductor with the use of a vacuum suction collet provided with a flat surface and trying to package the connection conductor onto the uneven connection portion by soldering, an open fault may occur such that only the higher level substrate is connected, leaving the lower level substrate not electrically connected.

This occurrence of the open fault makes it impossible to normally transmit an electrical signal of a high frequency, whereby an object of providing an electrical connection between the substrates is impaired.

To solve such a problem, it is required to provide a mechanism that eliminates a level difference.

Furthermore, since there are many cases where an expensive semiconductor or components, which are made of expensive materials, are packaged in a high-frequency circuit substrate, a higher cost is inevitable.

Accordingly, in the case of occurrence of any malfunction at any circuit or component, it is desirable that the circuit board is detachable so that the circuit substrate may be repaired or replaced as much as possible.

To realize this, an easily detachable structure is required.

In the known art as shown in the patent document 1, a disadvantage exits in that a local repair work is extremely hard to be done since a minute connection construction is employed.

In short, to achieve a packaging construction to which such conventional art as described above is applied induces a complicated work and a high cost due to decline in yield accompanied with the complicated work. After all, the packaging construction according to the conventional art lacks practicability in the case of manufacturing a product required for a mass production.

SUMMARY OF THE INVENTION

The present invention was made to solve the above-discussed problems, and a first object of the invention is to provide a connection structure in which positioning or handling of a connecting conductor (lead frame) becomes easy when connecting two coplanar high-frequency circuit substrates disposed in opposition, eventually resulting in high workability and productivity.

A second object of the invention is to provide a method for manufacturing the above-mentioned connection structure.

A third object of the invention is to provide a high-frequency circuit device, which possesses high assembly workability and productivity, or a high reliability over a long term despite change in ambient temperature, by providing a connection between the high-frequency circuit substrates using the above-mentioned connection structure.

A connection structure for a high-frequency circuit substrate according to the invention includes: a first high-frequency circuit substrate in which a first high-frequency transmission line is formed to an end on a substrate surface, and a first GND electrode is formed on both sides of the mentioned first high-frequency transmission line; and a second high-frequency circuit substrate in which a second high-frequency transmission line is formed to an end on a substrate surface, a second GND electrode is formed on both sides of the mentioned second high-frequency transmission line, and which is located coplanar with the mentioned first high-frequency circuit substrate; the mentioned first high-frequency circuit substrate and the second high-frequency circuit substrate being electrically connected.

The mentioned connection structure for the high-frequency circuit substrates further includes: a high-frequency transmission line lead frame for providing a connection between the end portion of the mentioned first high-frequency transmission line formed on the mentioned first high-frequency circuit substrate and the end portion of the mentioned second high-frequency transmission line formed on the mentioned second high-frequency circuit substrate; a plurality of GND electrode lead frames that are disposed in parallel to the mentioned high-frequency transmission line lead frame on both sides of the mentioned high-frequency transmission line lead frame, and that provides a connection between the mentioned first GND electrode on the mentioned first high-frequency circuit substrate and the mentioned second GND electrode on the mentioned second high-frequency circuit substrate; and a reinforcing substrate for integrally securing the mentioned high-frequency transmission line lead frame and a plurality of the mentioned GND electrode lead frames.

Thus, in the connection structure for a high-frequency circuit substrate according to the invention, positioning and handling of the high-frequency transmission line lead frame and a plurality of GND electrode lead frames acting as the connection conductors come to be easy at the time of electrically connecting together the two high-frequency circuit substrates disposed in opposition. As a result, connection between the high-frequency circuit substrates can be carried out in such a manner as to achieve a high workability and productivity.

A manufacturing method of a connection structure for a high-frequency circuit substrate according to the invention includes the steps of:

molding a high-frequency transmission line lead frame and a plurality of GND electrode lead frames into a comb shape of end portions being common by press working employing a metal plate having a predetermined resilience;

positioning the high-frequency transmission line lead frame and a plurality of GND electrode lead frames, which have been molded in a comb shape, to come to a predetermined position on the reinforcing substrate, and fixing them together at the predetermined position;

molding the high-frequency transmission line lead frame and a plurality of GND electrode lead frames, which have been fixed at the mentioned predetermined position on the mentioned reinforcing substrate, into a predetermined configuration by press working; and cutting a remainder of the high-frequency transmission line lead frame and a plurality of GND electrode lead frames, which have been fixed at a predetermined position on the mentioned reinforcing substrate and molded into a predetermined configuration by press working.

In the mentioned manufacturing method of a connection structure for a high-frequency circuit substrate according to the invention, positioning and handling of the high-frequency transmission line lead frame and a plurality of GND electrode lead frames acting as the connection conductors come to be easy at the time of electrically connecting together the two high-frequency circuit substrates oppositely disposed. As a result, a manufacturing method of a connection structure capable of providing a connection between the high-frequency circuit substrates is established in such a manner as to achieve a high workability and productivity.

A high-frequency circuit device according to the invention includes:

a first high-frequency circuit substrate, which is disposed on a metal base, at which a first high-frequency transmission line is formed to an end on a substrate surface, and a first GND electrode is formed on both sides of the mentioned first high-frequency transmission line;

a second high-frequency circuit substrate at which a second high-frequency transmission line is formed to an end on a substrate surface, and a second GND electrode is formed on both sides of the mentioned second high-frequency transmission line, the mentioned second high-frequency circuit substrate being disposed opposite to the mentioned first high-frequency circuit substrate on the mentioned metal base; and a connection structure for a high-frequency circuit substrate according to any of claims 1 through 7.

In the high-frequency circuit device of above construction, positioning and handling of the high-frequency transmission line lead frame and a plurality of GND electrode lead frames acting as the connection conductors come to be easy at the time of electrically connecting the two high-frequency circuit substrates disposed in opposition. As a result, connection between the high-frequency circuit substrates can be carried out in such a manner as to achieve a high workability and productivity thereby enabling to provide a high-frequency circuit device of a low price and a high reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
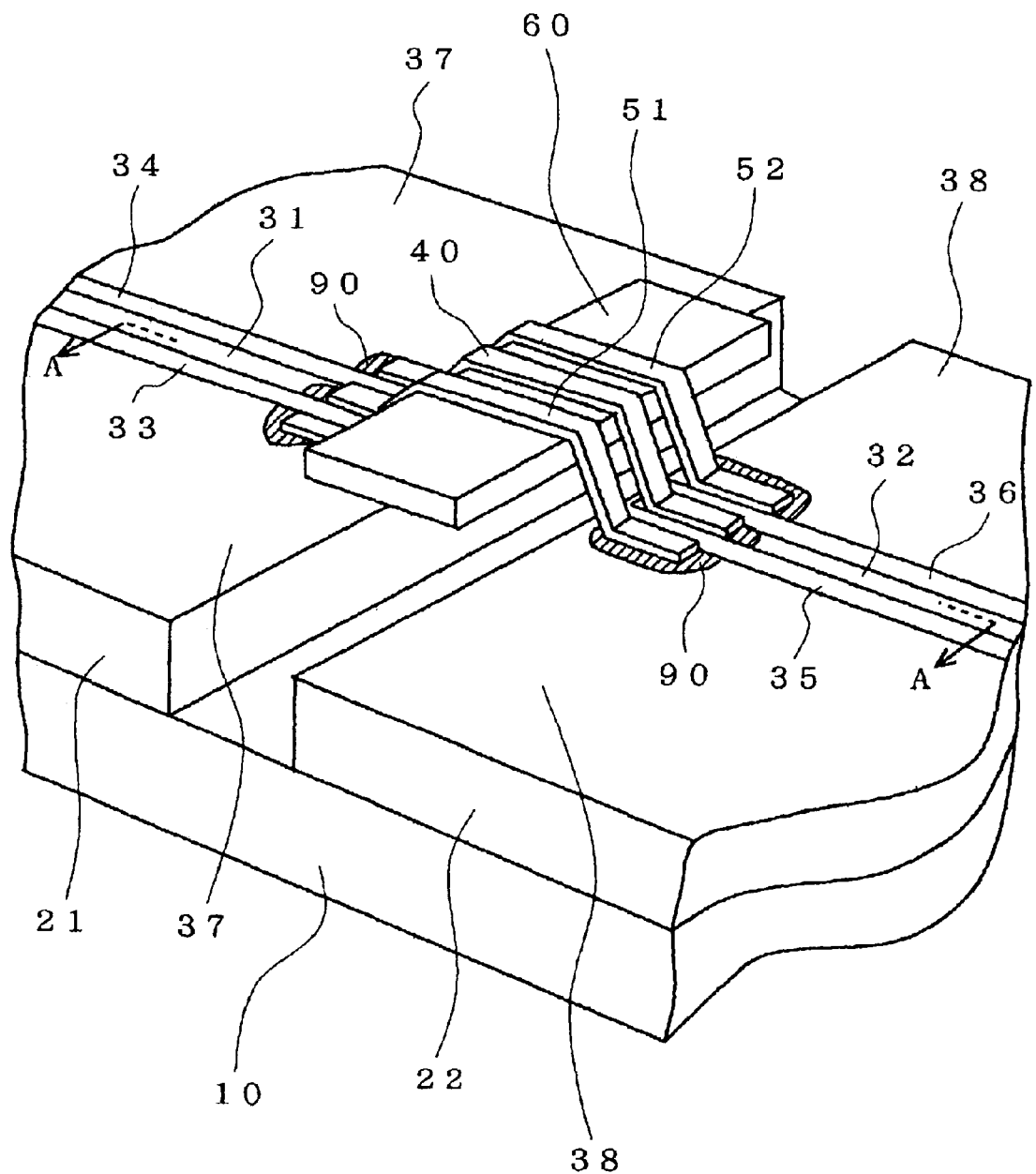
FIG. 1 is a prospective view showing a construction of a connection structure for a high-frequency circuit substrate according to a first preferred embodiment.

Several preferred embodiments according to the present invention are hereinafter described with reference to the accompanying drawings.

The same reference numerals designate the same or like parts throughout the drawings.

Embodiment 1

Figure 2:
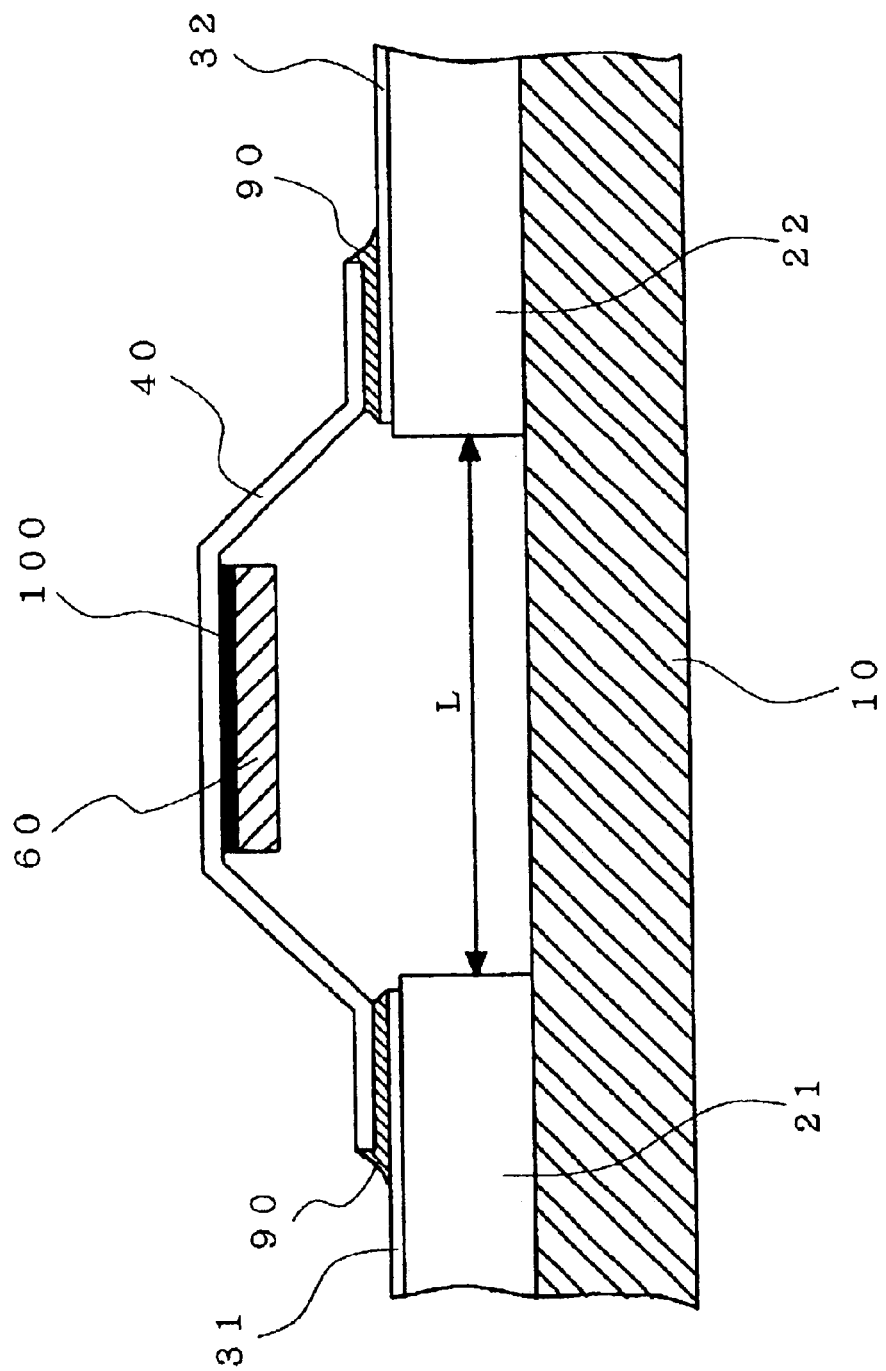
FIG. 2 is a cross sectional view taken along the line A—A of FIG. 1.

FIG. 1 is a prospective view showing a construction of a connection structure for a high-frequency circuit substrate according to a first preferred embodiment. FIG. 2 is a cross sectional view taken along the line A—A of FIG. 1.

With reference to FIG. 1 or 2, numeral 10 designates a metal base. Numerals 21 and 22 designate first and second high-frequency circuit substrates packaged (located) on a surface of the metal base 10.

Numeral 31 designates a first high-frequency transmission line formed to an end (including a portion proximate to the end) on the surface of the first high-frequency circuit substrate 21. Numeral 32 designates a second high-frequency transmission line formed to an end (including a portion proximate to the end) on the surface of the second high-frequency circuit substrate 22.

Numeral 37 designates a first GND electrode (reference electrode) formed on the surface of the first high-frequency circuit substrate 21 through etching grooves 33, 34 on both sides of the first high-frequency transmission line 31.

In the same manner, numeral 38 designates a second GND electrode (reference electrode) formed on the surface of the second high-frequency circuit substrate 22 through etching grooves 35, 36 on both sides of the second high-frequency transmission line 32.

In addition, the etching grooves 33 to 36 are of exposed resin material (for example, BT resin) that forms a substrate bed and is exposed due to fusion of a copper foil at the time of etching the copper foil on the surface of the high-frequency circuit substrate to form wiring of an electronic circuit, a signal transmission line and the like. The etching grooves 33 to 36 are approximately 0.2 mm in width, and approximately 0.05 mm in depth.

An electrical insulation between the high-frequency transmission line and the GND electrode (reference electrode) is kept by means of the etching grooves.

Further, numeral 40 designates a high-frequency transmission line lead frame (lead frame) that connects the end (including the portion proximate to the end) of the first high-frequency transmission line 31 formed on the first high-frequency circuit substrate 21, to the end (including the portion proximate to the end) of the second high-frequency transmission line 32 formed on the second high-frequency circuit substrate 22.

Moreover, numerals 51, 52 designate GND electrode lead frames that are disposed in parallel to the high-frequency transmission line lead frame 40 on both sides of the high-frequency transmission line lead frame 40, and connects the first GND electrode 37 of the first high-frequency circuit substrate 21 to the second GND electrode 38 of the second high-frequency circuit substrate 22.

In addition, numeral 60 designates a reinforcing substrate that integrally fixes and supports (holds) the high-frequency transmission line lead frame 40 and the GND electrode lead frames 51, 52 disposed in parallel on both sides of the high-frequency transmission line lead frame 40 with the use of an adhesive or an adhesive film 100.

Further, numeral 90 designates a solder, which provides soldering between the end portions of the high-frequency transmission line lead frame 40 and the end portions of the high-frequency transmission lines formed on the first and second high-frequency circuit substrates respectively, and soldering between the end portions of the GND electrode lead frame and the GND electrodes formed on the first and second high-frequency circuit substrates 21, 22 respectively.

Now, a detailed construction of the connection structure for a high-frequency circuit substrate according to the first embodiment is described in accordance with a manufacturing process.

First, a metal plate made of a phosphor bronze for a lead frame and the reinforcing substrate 60 are prepared.

Then, by press working of this metal plate, the high-frequency transmission line lead frame 40 and the GND electrode lead frames 51, 52 are molded so that the end portions on one side (or end portions of both sides) may be common (that is, a configuration like a comb).

In addition, it is also preferable to employ a commercially available terminal for a hybrid IC instead of press molding a metal plate for a lead frame.

The terminal for the hybrid IC is 0.15 mm in thickness of the lead, 0.3 mm in width of the lead, 0.5 mm in gap between the leads, and 0.8 mm in lead pitch, and nickel plated.

At this time, the metal plate for the lead frame is not bent into a trapezoidal configuration yet. The metal plate is provided in a planar state in which individual leads are formed common at the end portions on one side (or the end portions on both sides), and lined in order so that individual leads may not come apart but be lined forming a comb shape.

The reinforcing substrate 60 is manufactured using a typical FR-4 printed wiring board, and all of the copper film on the printed wiring board has preliminarily removed by etching.

The reinforcing substrate 60 is 0.3 mm in thickness, 1.8 mm in width, and 10 mm in length.

Now, bonding process between the lead frame and the reinforcing substrate is described.

As shown in FIG. 2, an adhesive film 100, which has been cut substantially in the same size as that of the reinforcing substrate 60, is stuck to one side of the reinforcing substrate 60.

The adhesive film 100 is 1.8 mm in width, 5 mm in length, and 0.14 mm in thickness.

The adhesive film 100 can be easily stuck to the surface of the reinforcing substrate 60 since the adhesive film 100 before being cured possesses an appropriate viscosity.

Furthermore, the surface of the reinforcing substrate 60 fits to the adhesive film 100 very well since minute concavities and convexities of 5–10 μm depth, which are produced by etching the copper foil, reside all over the surface.

Moreover, it is preferable to use any adhesive in place of the adhesive film 100 as a matter of course.

Next, the lead frame molded in a comb shape, is set at a predetermined position on the reinforcing substrate 60 onto which the adhesive film 100 is stuck, and subject to heat setting with the use of a heat tool.

Positioning between the reinforcing substrate 60 and the lead frame is conducted using a positioning pin. The heat setting is implemented for 30 seconds at a temperature of 200° C. using a heat tool that is treated by mold-release coating with Teflon (trademark). A load of 10N per 1 pin is applied to the reinforcing substrate 60 and the lead frame.

After completion of the adhesive bonding, a peel strength test between the adhesive and the reinforcing substrate and observation after polishing a cross section were carried out. As a result of this, peel strength of 0.8–1.5 kN/m being sufficiently reliable was obtained, and normal and effective joining was found from the results of observation on the cross section.

Next, the lead frame is bent into a trapezoidal configuration as shown in FIG. 2.

The bending into a trapezoid was manually carried out in the steps of manufacturing a dedicated die and setting the lead frame with the reinforcing substrate, which have been bonded together already, by hand press.

In this first embodiment, an upper base of the trapezoid (that is, a flat part fixed to the reinforcing substrate) is 1.8 mm in length, and an inclined part being projected on a horizontal plane is 0.8 mm in length. A part in contact with the high-frequency circuit substrate, that is, a part soldered and packaged is 1 mm in length.

The maximum height from a pattern face of the high-frequency circuit substrate (high-frequency transmission line upper surface) to the upper base of the lead frame is 0.55 mm.

Cutting of the remainder of the lead frame, which has been bent already, can be performed by the above-mentioned hand press.

The lead frame with the reinforcing substrate, which has been completed as described above, is mounted by placing flat parts extending outward from a lower plane of the trapezoid on the high-frequency circuit substrates, and heating the flat parts with the use of a soldering iron utilizing a wire solder (that is, mounted by soldering).

With reference to FIG. 2, the two adjacent high-frequency circuit substrates (i.e., the first high-frequency circuit substrate 21 and the second high-frequency circuit substrate 22) are made of, for example, a BT resin of 0.8 mm in thickness. A distance L between the two adjacent substrates is 2 mm, and the aluminum metal base 10 is 10 mm in thickness.

In FIG. 1 or 2, each lead frame is fixed to the reinforcing substrate 60 at a lower surface of the upper base of the trapezoidal configuration. It is, however, preferable that each lead frame is fixed to the reinforcing substrate 60 at the upper face of the upper base of the trapezoid.

Next, high frequency electric characteristics of the connection structure for the high-frequency circuit substrate according to this first embodiment, which is manufactured as mentioned above, were measured using a network analyzer.

Figure 3:
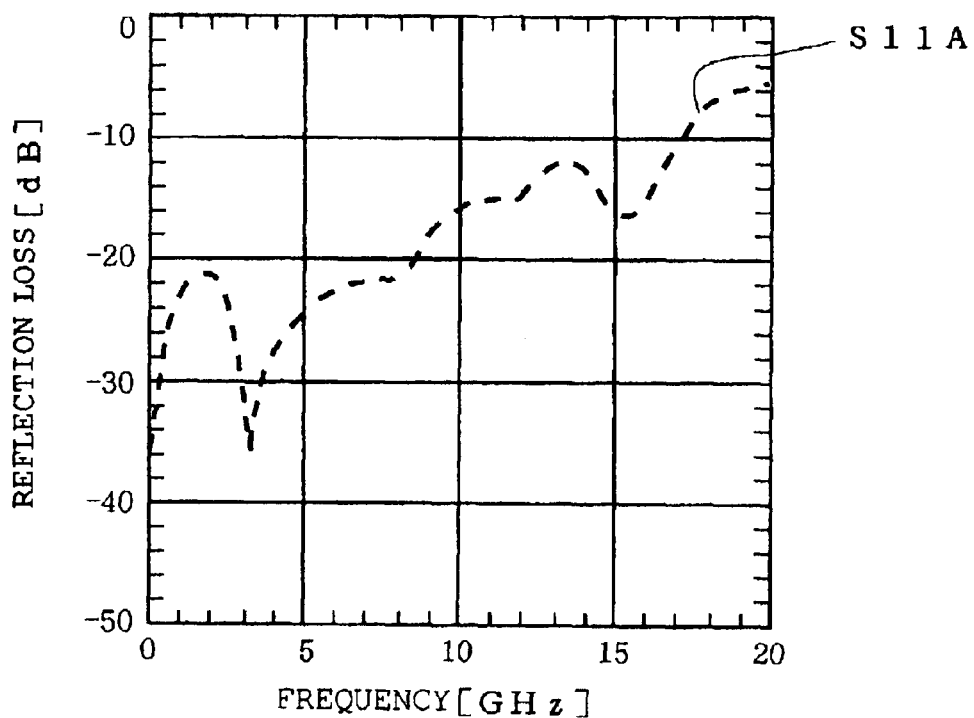
FIG. 3 is a chart showing reflection characteristic in the case of using the connection structure for a high-frequency circuit substrate according to the first preferred embodiment.

FIG. 3 shows an example of measuring reflection characteristic in a case where the connection structure according to this embodiment is used, with the use of a network analyzer.

In the drawing, the axis of abscissas indicates frequency and the axis of ordinates indicates a reflection loss. This characteristic shows degrees of reflection of an electrical signal at any discontinuous portion between predetermined circuit sections. It is preferable that reflection loss is as low as possible (that is, a value removing a minus sign is as large as possible).

A wavy line S11A in FIG. 3 indicates a reflection characteristic of the connection structure according to this embodiment.

It is understood from the drawing that, in the connection structure according to this embodiment, the value of S11A is kept to be not more than −20 dB from a low frequency region of less than 1 GHz to a high frequency region of approximately 8 GHz. This means that a connection structure possessing small reflection loss is obtained in this embodiment.

Figure 4:
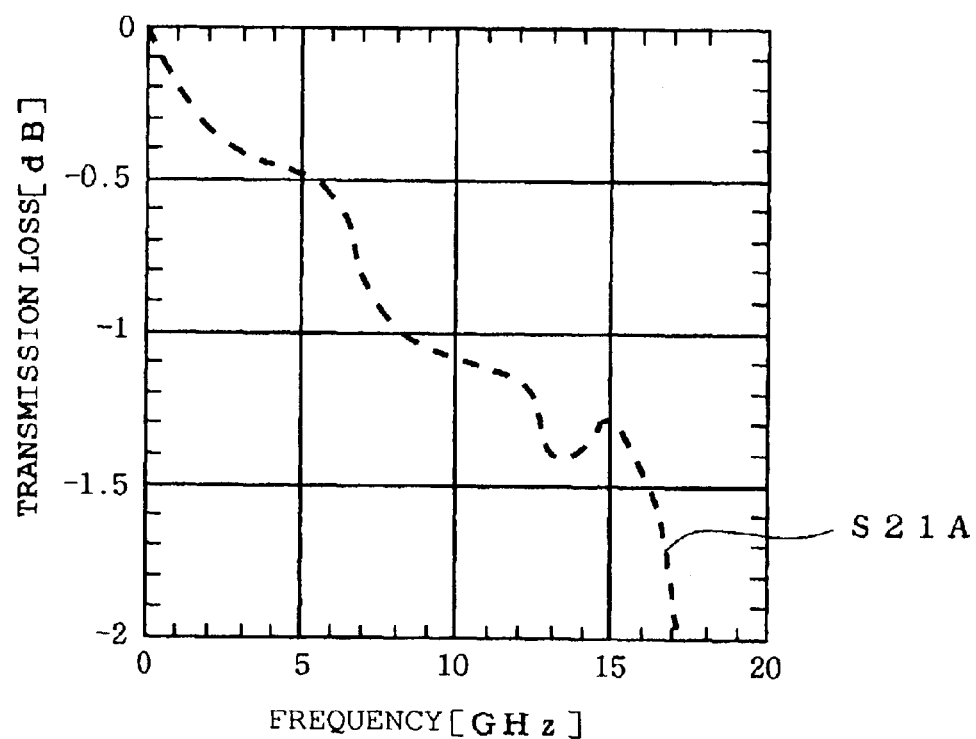
FIG. 4 is a chart showing transmission characteristic in the case of using the connection structure for a high-frequency circuit substrate according to the first preferred embodiment.

FIG. 4 is a chart showing a transmission characteristic, which means another high-frequency electric characteristic. The axis of abscissas indicates frequency, and the axis of ordinates indicates a transmission loss.

This characteristic shows degrees of loss of an electrical signal between predetermined circuit sections. Referring to this graph, it is to be interpreted more desirable that a value obtained by removing a minus sign is as small as possible, that is, as close as possible to 0. A wavy line S21 in the drawing indicates a transmission characteristic of the connection structure according to this embodiment.

The transmission characteristic shown herein is indicated by a value obtained by adding together line losses of the connection structure according to this embodiment and the two high-frequency circuit substrates electrically connected by this connection structure (BT resinous substrates in opposition).

It is understood from the drawing that in this embodiment, the value of S21A is kept to be larger than −1 dB from a low frequency region of not more than 1 GHz to a high frequency region of approximately 8 GHz.

This characteristic is shown in the form of a value obtained by adding line losses of the connection structure according to this embodiment and the two high-frequency circuit substrates electrically connected thereby. Nevertheless it is understood that this connection structure achieves a connection structure possessing a small transmission loss on the whole.

As a result of repeated experiments, it was acknowledged that when a value of level difference between the substrates is not more than 300 $\mu$m and a value of gap between the substrates is up to 3 mm, a connection structure satisfying −20 dB of reflection loss and −1 dB of transmission loss could be achieved on condition of a frequency range of not more than 8 GHz.

Accordingly, it was found that the structure according to this embodiment could be put into practical use from a low frequency region of not more than 1 GHz to a high frequency region of approximately 8 GHz.

Now, results of a reliability test conducted with the connection structure according to this embodiment are hereinafter described.

A heat cycle test was implemented as a reliability test.

A test sample subject to the heat cycle test was of the same construction as that of the connection structure of which forgoing electric characteristics were measured. This test sample was put into a heat cycle environmental test tank, and heat cycle tests were implemented in a temperature range from −55° C. to +125° C. by 1000 cycles.

After the test, whether or not there is any damage at a connection part was acknowledged by performing electrical conduction, microscopic observation, and observation after polishing a cross section.

Ten test samples in total were manufactured. Out of them, five samples were the ones having no level difference between the substrates, and the remaining five samples were the ones having a level difference of 300 $\mu$m in direction of height.

After ending the test, first it was acknowledged that there was no abnormality in electrical conduction.

Next, a soldered junction was observed in detail using a metal microscope.

Finally, the obtained connection portion was implanted in an epoxy resin, curing and securing the same, and the soldered junction was observed after polishing the cross section. As a result of this, no abnormality was detected at the soldered junction. Consequently it was found that a highly reliable joining was maintained.

As shown in the foregoing description, even in the case where there is any deformation such as warp, torsion, wave, or a level difference between the high-frequency circuit substrates located in opposition on the metal base, the connection structure according to this embodiment is desirably applicable. That is, application of the connection structure according to this embodiment ensures a superior packaging of smaller electric deterioration as well as no occurrence of any bad connection. Thus a highly reliable connection structure for a high-frequency circuit can be provided.

In addition, supplemental description about dimension..configuration.material of the lead frame, material of the reinforcing substrate, or manufacturing method of the connection structure according to this embodiment is given below.

Spacing between the electrodes of the lead frame (gap between the leads) is designed so as to have access to characteristic impedance (usually designed at 50Ω) of a transmission line on a high-frequency circuit substrate intended to be connected.

For example, supposing that a lead frame is designed through connection of coplanar-type transmission lines together, the lead frame can be constructed of three lines. Accordingly it is preferable to bring characteristic impedance in this structure as close as possible to that of the transmission line.

This design enables loss due to connection to be limited to an extremely small value.

When a dimension ratio of a lead width to a gap between the leads is 50%:50%, or any other ratio close to this ratio although there is no particular regulations, it is advantageous in the aspects of handling and manufacturing.

On the other hand, a problem exits in that a long-term reliability cannot be maintained without absorbing or diminishing in any way a mechanical stress (i.e., heat stress). The stress is generated at the connection portion due to difference in linear expansion coefficient of the substrate or the connection structure caused by change in ambient temperature.

Employing a mechanically resilient construction, that is, construction capable of expanding and contracting in response to the heat stress generated, successfully solves this problem.

At the same time, the employment of this construction is effective in solving the above-mentioned problems of warp, torsion and waves of the substrate, or a level difference between the substrates.

That is, these problems are solved by molding a lead frame into a trapezoidal or arched shape (referring to a second preferred embodiment described later) with a method of press working, thereby making a bridged structure between the substrates.

Thus, it is now possible to obtain a connection construction capable of absorbing or diminishing a mechanical mismatching between the substrates (i.e., warp, waves, level difference and the like), or a heat stress generated between the substrates while securing an electrical continuity between the opposed high-frequency circuit substrates.

As a result, it becomes possible to provide a connection structure for a high-frequency circuit satisfying the two requirements, that is, maintenance of high-frequency electric characteristic and absorption of (compensation for) a mechanical mismatching.

Any material can be adopted for constructing a lead frame as long as it is the material that possesses an appropriate resilience, can absorb or diminish warp, waves, level difference or the like between the substrates, and can absorb or diminish a heat stress resulted from difference in heat expansion.

For example, copper, phosphor bronze, brass and a copper alloy such as beryllium copper, iron, and iron alloy such as 4-2 alloy are used in view of electric and mechanical characteristics and workability.

As a product to meet these requirements, a lead terminal for a hybrid IC is commercially available.

Nickel plating is applied to a surface of the lead frame in the case of the lead terminal for a hybrid IC in order to improve wettability of the solder at the time of packaging, or prevent oxidization of exposed wiring portions.

A substrate composed of glass fiber and an organic polymer material such as glass epoxy or glass polyimide is suitable for a material of the reinforcing substrate due to superiority in terms of strength, workability, etc. As a product to meet these requirements, a printed wiring board is commercially available.

In addition to the above product, a resin-molded product made using a die, or a product made by machining a resinous plate can be also used.

As a resin, any thermosetting or thermoplastic resin can be employed, and use in combination with filler is possible.

A reinforcing substrate made of ceramics such as HTCC (High Temperature Co-Fired Ceramic), LTCC (Low Temperature Co-Fired Ceramic), etc. can be used.

Now, how to secure the lead frame to the reinforcing substrate is described. Employing one or two pieces of reinforcing substrates (see the fourth preferred embodiment later described) is conceivable.

The simplest method for securing a reinforcing substrate to a lead frame is bonding with an adhesive. In the case of one reinforcing substrate, a lead frame is superimposed on the upper surface of the reinforcing substrate, and a location adjustment is conducted after applying the adhesive, or the adhesive is applied after conducting the location adjustment. Then the adhesive is subject to heat setting. Alternatively, it is also preferable that the lead frame is superimposed later on the substrate to which an adhesive has been preliminarily applied.

An adhesive of liquid type or paste type is used.

A method for applying the adhesive includes printing with a syringe, screen-printing and the like.

Alternatively, it is preferable that the adhesive, which has been preliminarily applied onto the reinforcing substrate, is used after being partially set with a pretreatment such as heating.

An adhesive film unnecessary for such pretreatment can be also used, and it is recommended to selectively use them depending on the situations.

A thermosetting resin or thermoplastic resin, which is represented by an epoxy adhesive, can be used.

Curing of the adhesive or adhesive film is performed by heat-setting means such as heating tool, reflow furnace, drying furnace. Application of a load at the time of heating enables adhesive bonding in a highly accurate finish.

At the time of superimposing the lead frame on the reinforcing substrate, location adjustment marks for improving accuracy of the location adjustment are affixed, or a wiring pattern having line and space of the same dimensions to those of the lead frame are preliminarily formed on the substrate surface. This enables an easy point-to-point control and location adjustment as well as highly accurate location adjustment.

However, even if there is no such location adjustment mark or wiring pattern, a highly accurate positioning comes to be possible by using an externally auxiliary mechanism such as positioning pin.

In the case of two pieces of reinforcing substrates, adhesive bonding is carried out in such manner that the reinforcing substrates, which are opposed, may sandwich the lead frame. Basically, this way of adhesive bonding is similar to that in the case of one reinforcing substrate.

The above-mentioned description is made as for the case where an adhesive is used for securing the lead frame to the reinforcing substrate. It is, however, preferable to carry out securing not with an adhesive but by soldering. In this case, it is necessary to provide on the reinforcing substrate a solder pad capable of being joined by soldering.

After completing the adhesive bonding or joining between the lead frame and the reinforcing substrate, the lead frame and reinforcing substrate are molded into configuration capable of absorbing or diminishing a heat stress by press-working the lead frame part. A contour meeting this requirement includes a trapezoidal or arched shape.

In this manner, the lead frame is secured to the reinforcing substrate by adhesive bonding or other joining to realize an integral connection structure. This enables to handle it as one part even if the connection structure has a large number of pins (i.e., centipede-shaped structure in which both end portions of a great number of lead frames extend from the sides of one reinforcing substrate). Consequently, improvement in easy handling and much reduction in packaging time can be achieved.

The completed connection structure is packaged by soldering in such manner as to bridge between the adjacent high-frequency circuit substrates.

Specifically, the completed connection structure is placed for the time being at a predetermined position between the high-frequency circuit substrates, and thereafter, packaged by manual soldering using a reflow or soldering iron.

At this time, even if occurring any lift of the lead frame due to level difference between the substrates or the like, a fused solder spreads with being wet along a gap between a packaged pad on the high-frequency circuit substrate and the lead frame. Thus, there remains no void or gap left. This construction enables to provide a connection structure having a highly reliable connection.

In this manner, a connection structure capable of absorbing or diminishing a mechanical mismatching (i.e., warp, waves, level difference and the like) between the substrates while securing an electrical continuity can be obtained.

That is, a heat stress, which is generated due to difference in linear expansion coefficient of the materials forming the connection part, is diminished (or absorbed) by press molding a central portion of each lead frame into a trapezoid or arched shape. Thus, it becomes possible to easily connect the substrates having a level difference therebetween only by the connection structure being inclined.

Furthermore, because the solder gets round the connection portions, occurrence of a slight lift of the lead frame becomes no problem.

As described above, a connection structure for a high-frequency circuit substrate according to the invention includes:

a first high-frequency circuit substrate in which a first high-frequency transmission line is formed to an end (including a portion proximate to the end) on a substrate surface, and a first GND electrode is formed on both sides of the mentioned first high-frequency transmission line; and a second high-frequency circuit substrate in which a second high-frequency transmission line is formed to an end (including a portion proximate to the end) on a substrate surface, a second GND electrode is formed on both sides of the mentioned second high-frequency transmission line, and which is located coplanar with the mentioned first high-frequency circuit substrate; the mentioned first high-frequency circuit substrate and the second high-frequency circuit substrate being electrically connected. This connection structure for the high-frequency circuit substrates further includes: a high-frequency transmission line lead frame for providing a connection between the end portion of the mentioned first high-frequency transmission line formed on the mentioned first high-frequency circuit substrate and the end portion of the mentioned second high-frequency transmission line formed on the mentioned second high-frequency circuit substrate; a plurality of GND electrode lead frames that are disposed in parallel to the mentioned high-frequency transmission line lead frame on both sides of the mentioned high-frequency transmission line lead frame, and that provides a connection between the mentioned first GND electrode on the mentioned first high-frequency circuit substrate and the mentioned second GND electrode on the mentioned second high-frequency circuit substrate; and a reinforcing substrate for integrally securing the mentioned high-frequency transmission line lead frame and a plurality of the mentioned GND electrode lead frames. As a result, positioning and handling of the minute connection conductor (lead frame) come to be easy at the time of connecting together the two high-frequency circuit substrates disposed in opposition, thereby enabling to provide a connection structure of a high workability and productivity.

Furthermore, the high-frequency transmission line lead frame and a plurality of GND electrode lead frames are made of metallic materials possessing a predetermined resilience. Those lead frames are molded into a trapezoid at a central portion, and integrally secured to the reinforcing substrate at the upper base of the portion molded into the trapezoid to be supported by the reinforcing substrate. As a result, positioning and handling of the connection conductor (lead frame) come to be easy at the time of connecting together the two high-frequency circuit substrates disposed in opposition, thereby enabling a high workability and productivity. Furthermore, it becomes possible to absorb a heat stress at each lead frame, thereby enabling a high reliability in response to change in ambient temperature over a long time.

Embodiment 2

A connection structure for a high-frequency circuit substrate according to a second preferred embodiment of the present invention is hereinafter described.

Materials of each component in this embodiment are basically the same as those in the foregoing first embodiment, and therefore aspects different from of the connection structure according to the first embodiment are mainly described.

Figure 5:
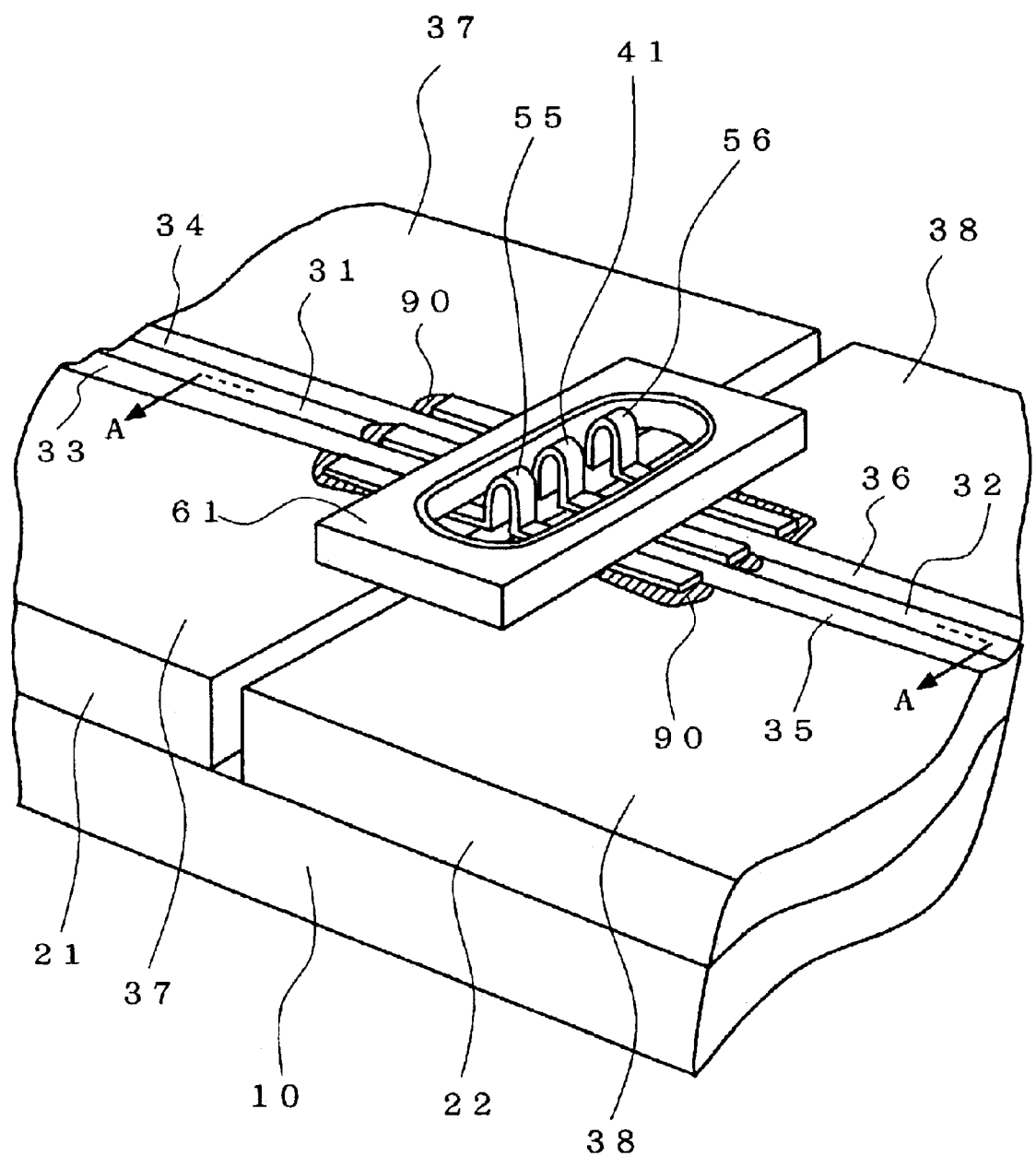
FIG. 5 is a prospective view showing construction of a connection structure for a high-frequency circuit substrate according to a second preferred embodiment.
Figure 6:
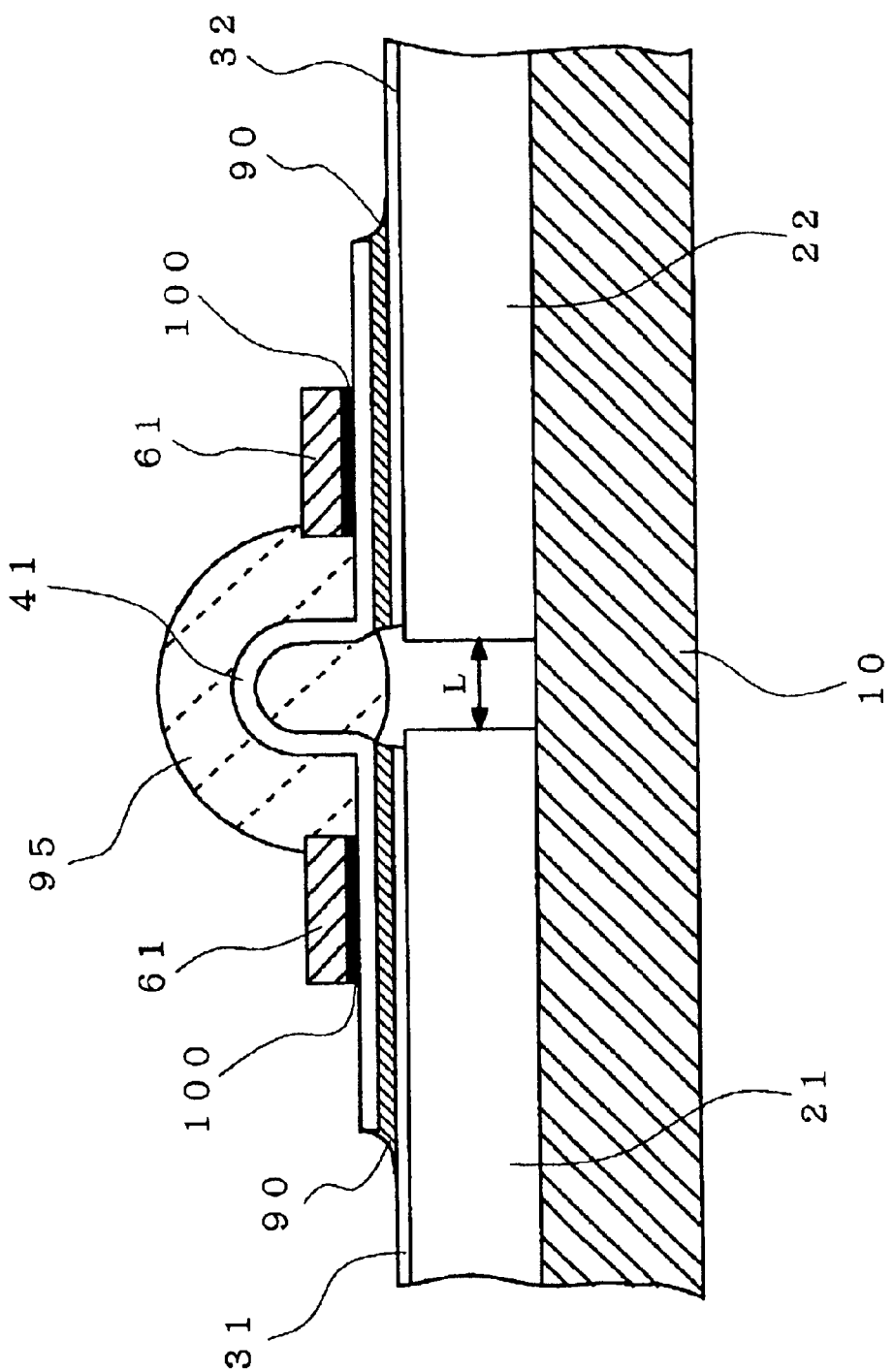
FIG. 6 is a cross sectional view taken along the line A—A of FIG. 5.

FIG. 5 is a perspective view showing a construction of a connection structure for a high-frequency circuit substrate according to this second embodiment, and FIG. 6 is a cross sectional view taken along the line A—A of FIG. 5.

With reference to FIG. 5 or 6, reference numeral 41 designates a high-frequency transmission line lead frame for connection between the end portion of the first high-frequency transmission line 31 formed on the first high-frequency circuit substrate 21 and the end portion of the second high-frequency transmission line 32 formed on the second high-frequency circuit substrate 22.

Numerals 55, 56 designate GND electrode lead frames that are disposed in parallel to the high-frequency transmission line lead frame 41 on both sides of the high-frequency transmission line lead frame 41. These GND lead frames 55, 56 provide a connection between the first GND electrode 37 of the first high-frequency circuit substrate 21 and the second GND electrode 38 of the second high-frequency circuit substrate 22.

Numeral 61 designates a reinforcing substrate that integrally fixes the high-frequency transmission line lead frame 41 and the GND electrode lead frames 55, 56 disposed in parallel on both sides of the high-frequency transmission line lead frame 41 with the use of an adhesive or an adhesive film 100 thereby supporting (holding) the GND electrode lead frames 55, 56.

The connection structure according to this embodiment is characterized in that a central portion of each lead frame (i.e., the high-frequency transmission line lead frame 41 and the GND electrode lead frames 55, 56) is molded into an arched shape by press working, and that an opening in which an arch part (part molded in an arched shape) of each lead frame is inserted, is formed at a central portion of the reinforcing substrate 61 that supports each lead frame.

The connection structure according to this embodiment is advantageous in the case where a distance between the first high-frequency circuit substrate 21 and the second high-frequency circuit substrate 22, which are disposed adjacently in opposition, is short (for example, not longer than 1 mm).

Furthermore, the connection structure according to this embodiment is also advantageous when a connection structure of a small height is required by the reason of limited spatial room for the connection portion.

In general, joining with the use of a connection structure for a high-frequency circuit substrate requires connection matching in terms of the high-frequency circuit.

The lines of the connection structure (that is, lead frames) are constructed so as to avoid being lifted from the substrate surface of the high-frequency circuit substrate as much as possible, thereby enabling to suppress mismatching.

Therefore, in the case where a distance L between the substrates of the opposed high-frequency circuit substrates is small (for example, not longer than 1 mm), the connection structure according to this second embodiment having a flat construction is more advantageous than the connection structure according to the foregoing first embodiment.

The reinforcing substrate 61 according to this second embodiment is of a ring shape having an opening at the central portion thereof.

When adhesive-bonding each lead frame (i.e., the high frequency transmission line lead frame 41 and the GND electrode lead frames 55, 56) to the reinforcing substrate 61, first the lead frames.are molded into an arched shape using a press machine.

In this process, likewise the foregoing first embodiment, each of the lead frames are not separated, and handled in the state of being connected like the teeth of a comb.

Next, the adhesive film 100 is stuck to the reinforcing substrate 61 for the time being.

Specifically, the adhesive film 100, which is the same as that used in the foregoing first embodiment, being punched in the same shape as that of the reinforcing substrate 61, is stuck to the entire surface on one side of the reinforcing substrate 61.

However, this process is carried out so as not to reside the adhesive film at the opening.

Then, the same heating and pressing as in the foregoing first embodiment are conducted thereby completing the bonding using the adhesive film.

In the connection structure according to this embodiment, the arch part of each lead frame after the molding is exposed from the opening facing upward, and therefore it can be said that such a construction is relatively susceptible to occurrence of leakage of electromagnetic waves.

To prevent such leakage, a method for potting resin having a specific inductive capacity of 3–8, i.e., a small dielectric loss is conceivable.

By this method, a connection structure achieving reduction in unnecessary radiation can be obtained because an electromagnetic field, which leaks to outside, can be effectively confined in an internal part of the dielectric.

In FIG. 6, the construction in the case of implementing a resin potting 95 is shown.

However, this resin potting 95 is not always indispensable. But it is preferable to employ appropriately the resin potting 95 depending upon required electric characteristics.

After completion, as a result of conducting the same reliability test as in the foregoing first embodiment, any abnormality was not detected also in this second embodiment.

As described above, in the connection structure for a high-frequency circuit substrate according to this second embodiment, the high-frequency transmission line lead frame and a plurality of GND electrode lead frames are made of a metallic material having a predetermined resilience. An arch part is molded at a central portion thereof, and the reinforcing substrate is provided with an opening in which the arch part of each lead frame is inserted. The high-frequency transmission line lead frame and a plurality of GND electrode lead frames are integrally secured and supported in a state that the arch part of each lead frame is inserted in the mentioned opening. As a result, it becomes possible to prevent each frame (that is, the high-frequency transmission line lead frame and the plurality of GND electrode lead frames) from being lifted from the substrate surface of the high-frequency circuit substrate as much as possible. Thus, a connection sufficiently matching in terms of a high-frequency circuit can be achieved.

In addition, the arch part of the high-frequency transmission line lead frame and the plurality of GND electrode lead frames, which is inserted into the opening of the reinforcing substrate, possesses a predetermined dielectric constant and is potted with a resin having a low dielectric loss. As a result, even if the arch part of each lead frame is exposed from the opening of the reinforcing substrate, unnecessary radiation from each lead frame can be reduced.

Embodiment 3

Figure 7:
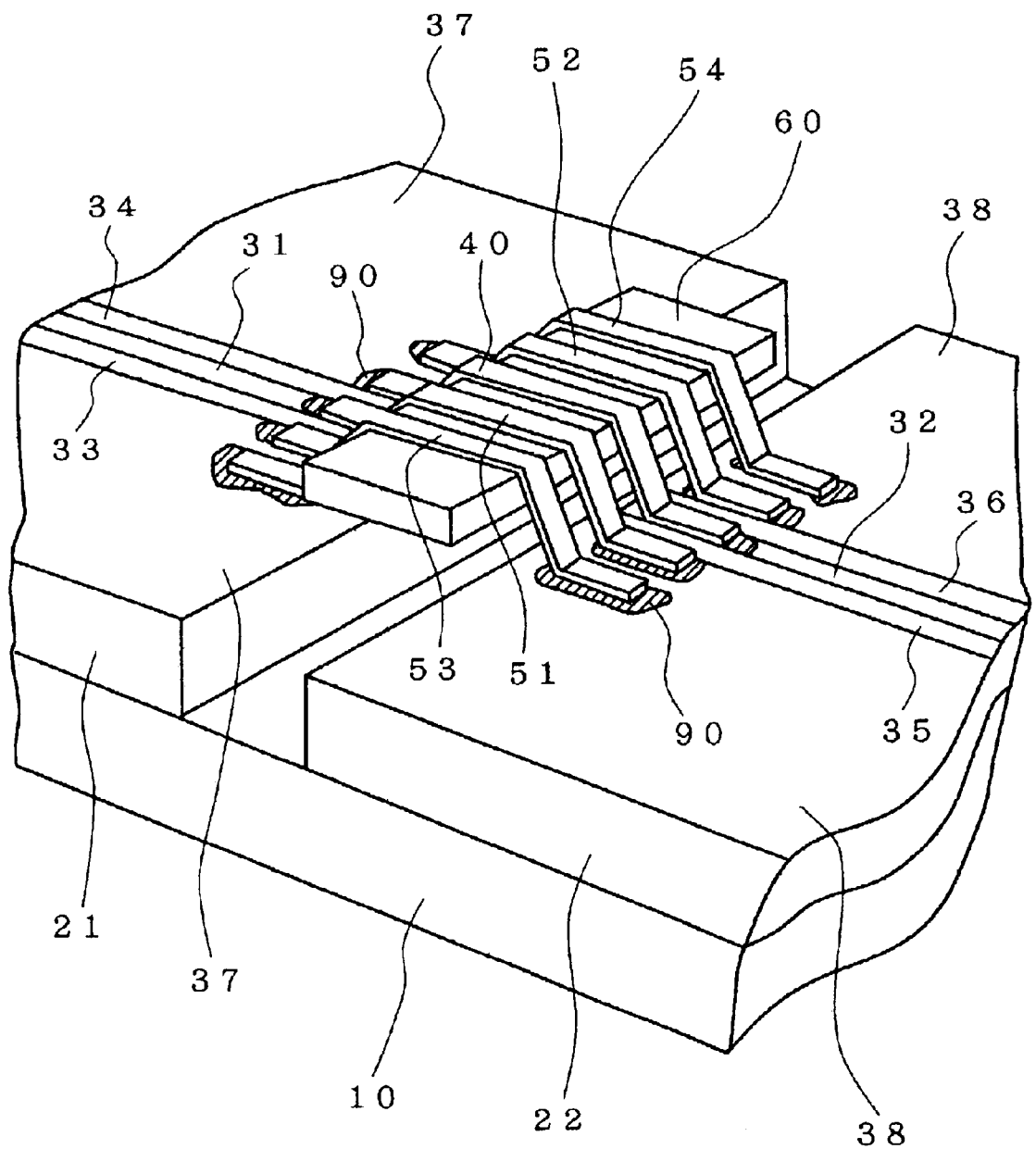
FIG. 7 is a perspective view showing construction of a connection structure for a high-circuit substrate according to a third preferred embodiment.

FIG. 7 is a perspective view showing a construction of a connection structure for a high-frequency circuit substrate according to a third preferred embodiment.

The connection structure for the high-frequency circuit substrates according to this second embodiment is substantially the same as the connection structure according to the above-mentioned first embodiment basically.

Different aspect is that reinforcing GND electrode lead frames 53, 54 are further disposed outside the two GND electrode lead frames 51, 52 disposed on both sides of the high-frequency transmission line lead frame 41.

That is, two GND electrode lead frames are formed respectively on each side of the high-frequency transmission lead frame.

This construction increases a mechanical stability so that mountability at the time of packaging is improved.

In addition, due to the fact that the number of lead frames, which are joined by soldering, increases, a mechanical strength at the connection portion is improved thereby achieving improvement in reliability.

Further, e.g., electric characteristic is the same as in the case of the connection structure according the first embodiment.

Besides, although the case where two GND electrode lead frames are disposed respectively on each side of the high-frequency transmission line lead frame is shown in FIG. 7, it is preferable to be construction in which three or more GND electrode lead frames are disposed respectively on each side of the high-frequency transmission line lead frame.

Furthermore, also in the connection structure according the second embodiment, it is preferable to employ construction in which three or more GND electrode lead frames are disposed respectively on each side of the high-frequency transmission line lead frame.

As described above, in the connection structure for the high-frequency circuit substrate according to this third embodiment, a plurality of GND electrode lead frames are disposed respectively on each side of the high-frequency transmission line lead frame. As a result, a mechanical strength at the connection portion between the high-frequency circuit substrate and the connection structure improves, and reliability is further improved.

Embodiment 4

Figure 8:
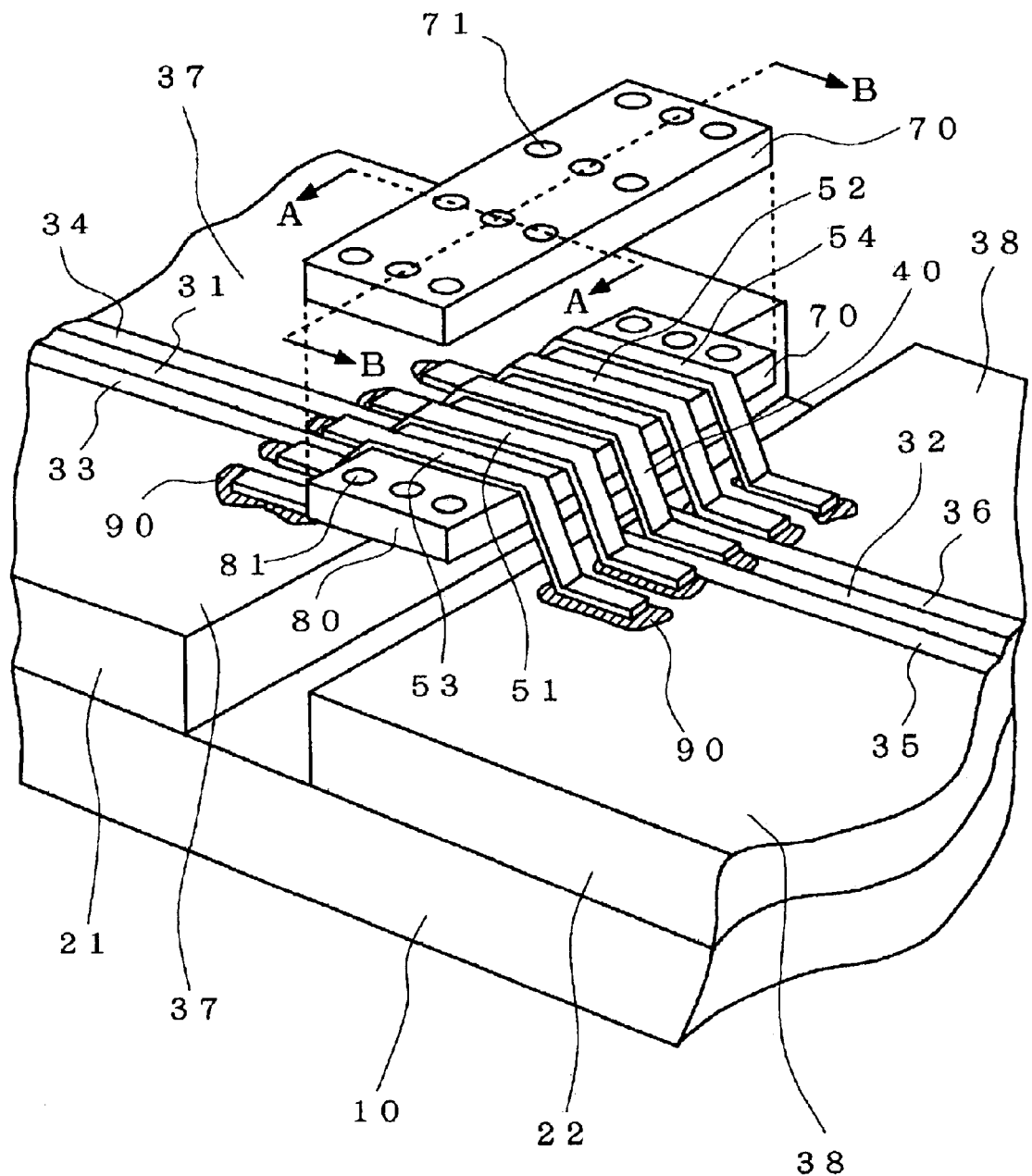
FIG. 8 is a perspective view showing construction of a connection structure for a high-frequency circuit substrate according to a fourth preferred embodiment.
Figure 9:
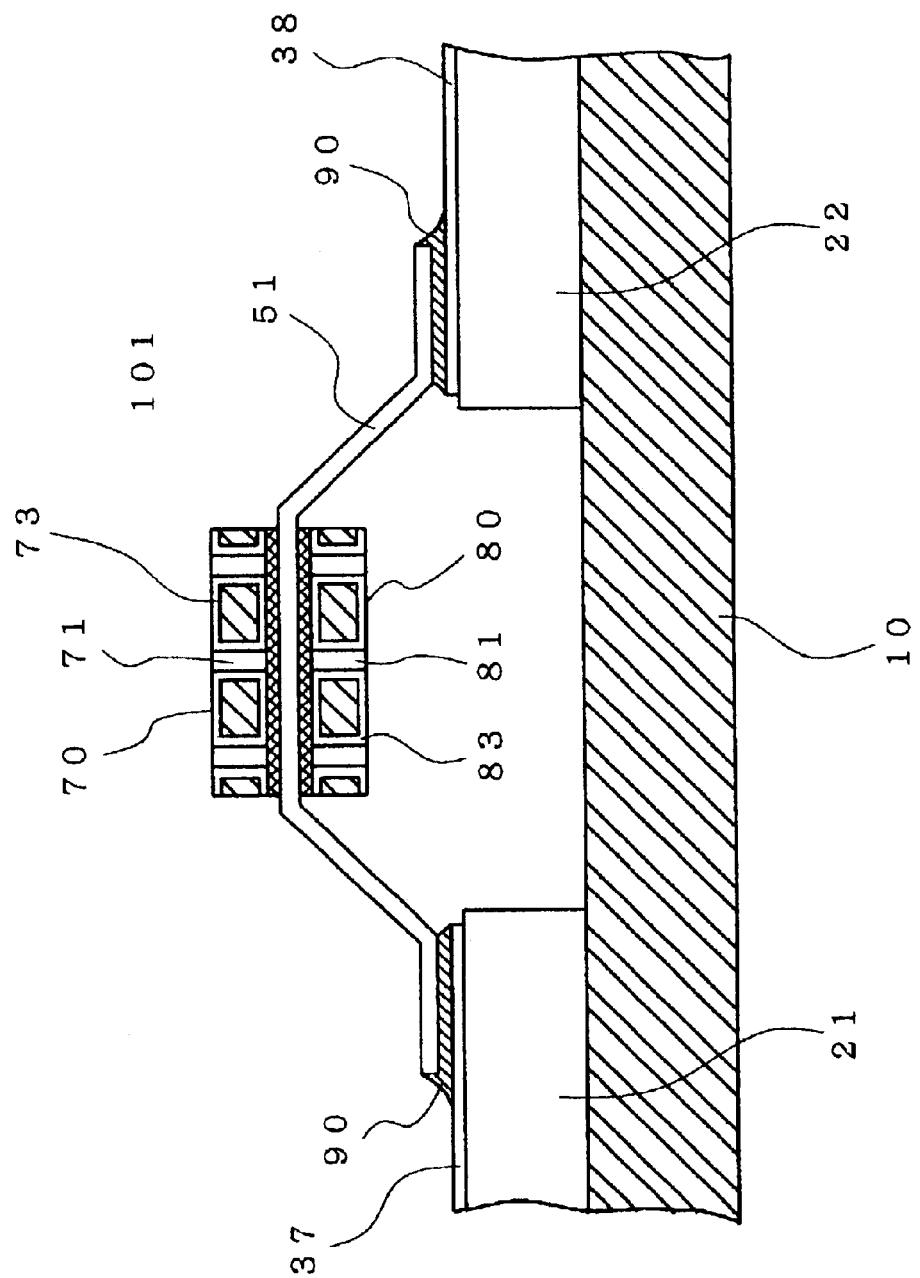
FIG. 9 is a cross sectional view taken along the line A—A of FIG. 8.
Figure 10:
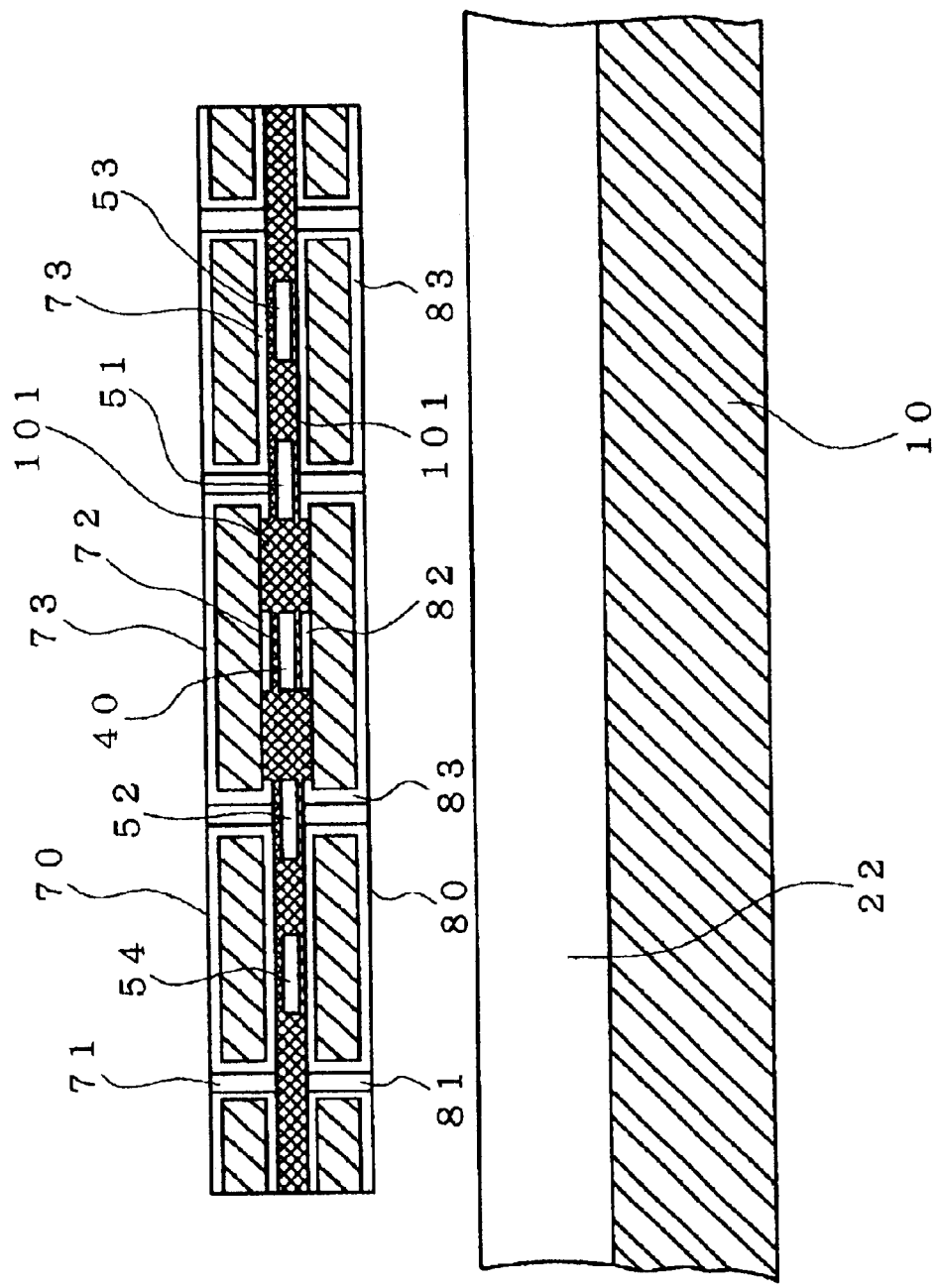
FIG. 10 is a cross sectional view taken along the line B—B of FIG. 8.

FIG. 8 is a perspective view showing construction of a connection structure for a high-frequency circuit substrate according to a fourth preferred embodiment. Further, FIG. 9 is a cross sectional view taken on line A—A of FIG. 8. FIG. 10 is a cross sectional view taken on line B—B of FIG. 8.

With reference to FIGS. 8 to 10, reference numeral 70 designates an upper reinforcing substrate. Numeral 71 designates a through hole provided in the upper reinforcing substrate 70. Numeral 72 designates a high-frequency transmission line wiring pattern formed at the upper reinforcing substrate 70. Numeral 73 designates a GND wiring pattern formed at the upper reinforcing substrate 70.

In addition, numeral 80 designates a lower reinforcing substrate. Numeral 81 designates a through hole provided in the lower reinforcing substrate 80. Numeral 82 designates a high-frequency transmission line wiring pattern formed at the lower reinforcing substrate 80. Numeral 83 designates a GND wiring pattern formed at the lower reinforcing substrate 80.

Moreover, numeral 101 designates an ACF (Anisotropic Conductive Film).

Other parts are the same as those in FIG. 1 or 7.

As shown in FIGS. 9, 10, the wiring patterns are formed at the upper reinforcing substrate 70 and the lower reinforcing substrate 80.

The wiring patterns include the high-frequency transmission line wiring pattern 72 formed at the upper reinforcing substrate 70, the high-frequency transmission line wiring pattern 82 formed at the lower reinforcing substrate 80, the GND wiring pattern 73 formed at the upper reinforcing substrate 70, and the GND wiring pattern 83 formed at the lower reinforcing substrate 80. These wiring patterns are formed by etching copper foils on the printed wiring boards respectively.

Nickel plating is applied onto respective wiring patterns, which are formed by etching, and further gold plating is applied thereon.

These wiring patterns reside on the exterior and interior surfaces of the upper reinforcing substrate 70 and the lower reinforcing substrate 80. The through holes 71, 81, which provide a connection between the exterior surface and the interior surface, are formed at the GND wiring pattern portions.

There are only GND wiring patterns on the exterior surfaces of the upper reinforcing substrate 70 and lower reinforcing substrate 80.

Herein, the interior surface is a substrate surface on the side of the upper reinforcing substrate 70 and the lower reinforcing substrate 80 being opposite to each other. The exterior surface is the substrate surface on the side opposite to this interior surface (upper substrate surface of the upper reinforcing substrate and lower substrate surface of the lower reinforcing substrate).

The high-frequency transmission line wiring pattern, which is electrically connected to the high-frequency transmission line lead frame, and the GND wiring pattern are provided on the interior surface of the upper reinforcing substrate 70 and the lower reinforcing substrate 80. The through holes providing a connection between the exterior and interior surfaces are formed at intervals as shown in the drawing.

In addition, the GND wiring patterns are formed on the substrate surface (both of the interior and exterior surfaces) at the regions electrically isolated from the high-frequency transmission line wiring pattern at the upper reinforcing substrate 70 and lower reinforcing substrate 80.

In the connection structure according to this embodiment, the high-frequency transmission line lead frame is adjusted in location so as to be superimposed onto the high-frequency transmission line wiring pattern formed on the interior surface of the reinforcing substrate with this wiring pattern being marks, and bonded with the use of the ACF (Anisotropic Conductive Film) 101.

The ACF (Anisotropic Conductive Film) 101 is the same in dimension as the adhesive film 100 described in the first embodiment.

The ACF 101 is also the same in thickness. The ACF (Anisotropic Conductive Film) 101 is, however, stuck to the upper reinforcing substrate 70 and the lower reinforcing substrate 80 respectively.

Adhesion of the upper and lower reinforcing substrates to the lead frame is effected by resinous components within the ACF. An electrical conduction between the wiring patterns of the upper reinforcing substrate and lower reinforcing substrate, and the lead frame is performed by conductive particles in the ACF, which are sandwiched between the wiring pattern and the lead frame.

Curing of the ACF 101 is carried out using a dedicated heat tool. Curing conditions are 50 N of load (10 N per 1 pin), and one minute of heat setting time period at a temperature of 200° C. The reason why a heat setting time period is longer than in the case of the first embodiment is that heat is conducted via the upper reinforcing substrate 70 and the lower reinforcing substrate 80.

After completion, a substrate packaging is carried out in the same way as in the case of the first embodiment.

Now, results of measuring high-frequency electric characteristic of the connection structure according to this embodiment are described.

The connection structure according to the fourth embodiment is to be devised so as to be adapted for use especially in regions of a high frequency, for example, in a frequency band above 10 GHz. As a connection construction, a square-shaped coaxial line (that is, a coaxial line construction having a square cross section) is formed.

Therefore, actual measurements of high-frequency electric characteristic according to this embodiment were conducted carefully in particular.

Figure 11:
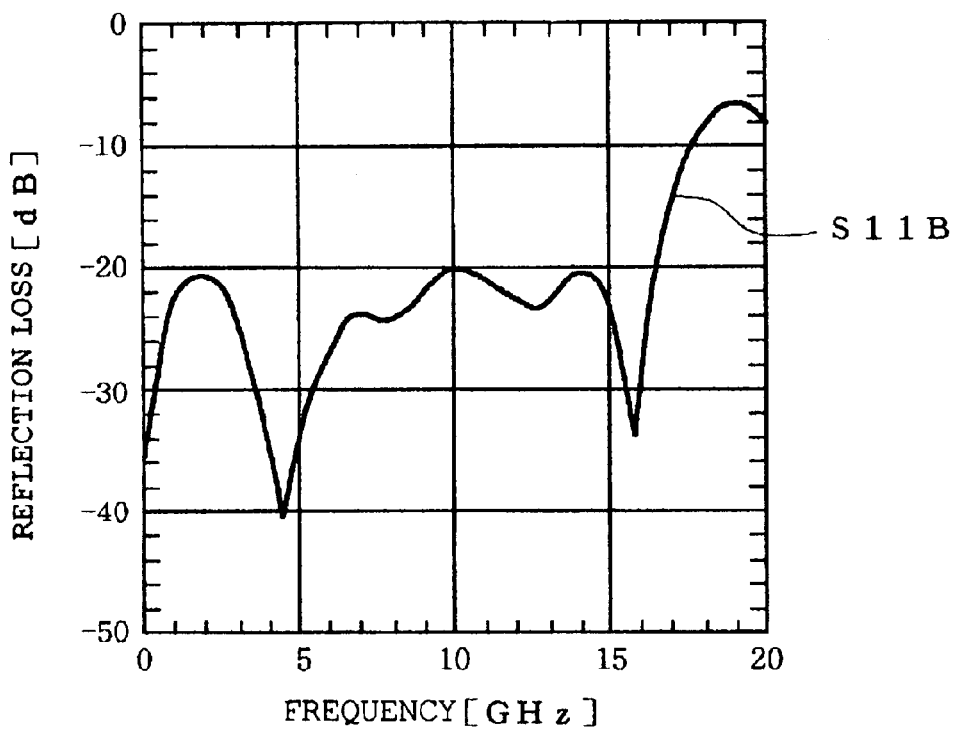
FIG. 11 is a chart showing reflection characteristic in the case of using the connection structure for a high-frequency circuit substrate according to the fourth preferred embodiment.

FIG. 11 shows an example obtained by measuring reflection characteristic in the case of using the connection structure according to this embodiment with the use of a network analyzer.

A solid line in the chart, that is, S11B indicates reflection characteristic in the connection structure according to this embodiment.

As seen from the chart, in the connection structure according to this embodiment, values of S11B of not more than −20 dB were maintained from regions of a low frequency of not more than 1 GHz to regions of a high frequency of up to approximately 17 GHz. Thus a connection structure having a small reflection loss is found to come about.

Figure 12:
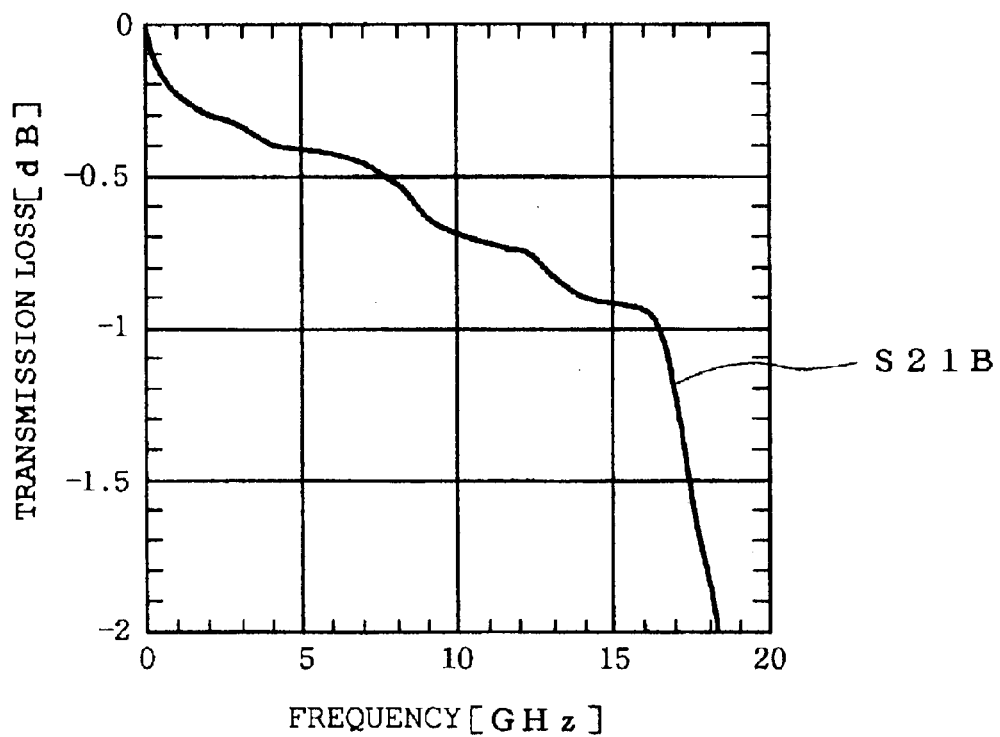
FIG. 12 is a chart showing transmission characteristic in the case of using the connection structure for a high-frequency circuit substrate according to the fourth preferred embodiment.

FIG. 12 is a chart showing transmission characteristic, which are another high-frequency electric characteristic.

A solid line in the chart, that is, S21B indicates transmission characteristic in the connection structure according to this embodiment.

In the same way as in the case of the first embodiment, these characteristic are values obtained by adding line losses of the connection structure according to this embodiment and the substrates (BT resinous substrates in opposition) packaging the connection structure.

As seen form the chart, in the connection structure according to this embodiment, values of S21B of larger than −1 dB were maintained from regions of a low frequency of not more than 1 GHz to regions of a high frequency of up to approximately 17 GHz. Thus a connection construction having a small transmission loss is found to come about.

That is, although these characteristic are values obtained by adding line losses of the connection structure according to this embodiment and the substrates packaging the connection structure, a connection construction having a small transmission loss is found to come about in the same way as in terms of reflection characteristic.

As a result of repeated experiments, in cases where a value of level difference between the substrates is not more than 300 μm, and a value of gap between the substrates is up to 3 mm, a connection construction satisfying −20 dB of reflection loss and −1 dB of transmission loss in a frequency band of not more than 17 GHz could be realized. Accordingly this construction was found to be capable of being put to practical use from regions of a low frequency of not more than 1 GHz to regions of a high frequency of up to approximately 17 GHz.

The same reliability test as in the case of the first embodiment was implemented with the completed connection structure. Any abnormality, however, was not detected.

In addition, in the embodiment shown with reference to FIGS. 8–10, the case where a shape of the lead frame is a trapezoid is described as an example. It is, however, preferable that any configuration is employed as long as it is a construction of capable of transmitting a high-frequency signal without loss as well as absorbing a heat stress.

Further, although an example of two GND electrode lead frames being disposed on both sides of the high-frequency transmission line lead frame, the number of the GND lead frames is not limited to this case. It is preferable that one or not less than three GND lead frames are disposed on both sides of the high-frequency transmission line lead frame as a matter of course.

Moreover, herein additional descriptions of the connection structure according to this embodiment are made as follows.

In the case where the connection structure is used in a higher-frequency band, for example, a band of above 10 GHz called as K band, an electromagnetic shield construction is built for suppressing an unwanted radiation of electromagnetic waves from the lead frame body.

This electromagnetic shield construction enables to obtain a connection construction having a low loss even in a high frequency.

That is, in the connection structure according to this embodiment, the connection construction composed of the lead frame and the reinforcing substrate is devised so that both components may be assembled and formed into square-shaped coaxial line (coaxial line construction having a square cross section) thereby realizing a method for preventing an unwanted radiation of electromagnetic waves. Hereinafter, the method thereof is described.

A square-shaped coaxial line as a connection structure is realized by construction of the reinforcing substrates sandwiching the lead frame. In this sandwich construction, the high frequency transmission line wiring pattern, which is formed on the side of the high-frequency transmission line lead frame and the reinforcing substrate being in contact, that is, on the interior side of the reinforcing substrate, acts as a main conductor, and the GND lead frame and the GND wiring patterns formed on the interior and exterior sides of the reinforcing substrate, which are resided in the peripheral portion of the high-frequency transmission line wiring pattern, surround the main conductor.

Herein, it is necessary that the GND wiring patterns, which are formed on the interior and exterior sides of the reinforcing substrate, has been preliminarily connected electrically via a through hole, that the high-frequency transmission line lead frame and the high-frequency transmission line wiring pattern formed on the interior side of the reinforcing substrate are in an electrical connection, and that the GND electrode lead frame and the GND wiring pattern on the reinforcing substrate are in an electrical connection.

Nevertheless, only the main conductor can be left out since a square-shaped coaxial line can be formed without the high-frequency transmission line wiring pattern on the reinforcing substrate.

To provide an electrical connection between the lead frame and the wiring pattern on the surface of the reinforcing substrate, an adhesion method only with resin cannot be utilized since resin in itself does not have a conductive function.

Then connection is carried out using an ACF (Anisotropic Conductive Film) having a conductive connection function at portions required for electrically connecting the lead frame to the reinforcing substrate and demonstrating function as insulation adhesive at the other portions.

That is, conductive particles within the ACF are sandwiched and held between the lead frame and the wiring pattern on the reinforcing substrate thereby enabling to obtain an electrical conduction. The ACF functions merely as an adhesive at the portions where the particles are not held between the electrodes.

Gold-plating is applied to the surface of the wiring pattern in order to demonstrate functions of the ACF further assuredly so that there is no occurrence of e.g., loose connection due to oxidization and the like.

As material other than the ACF, connection can be done using a solder. In the case of soldering, it is necessary to care about extrusion and overflow of the solder so that joining may be done only at the metal portions.

To realize this construction, it is optimal to apply a commercially available printed wiring board to the reinforcing substrate.

The reason why the commercially available printed wiring board is utilized is that wiring for providing a connection between both sides of the reinforcing substrate can be easily realized by means of a through hole.

The above-mentioned construction enables an electromagnetic field, which has been leaked outward, to be effectively confined in an internal part of the square-shaped coaxial line. Further a connection construction in which an unwanted radiation is reduced can be realized.

As a result, it comes to be possible to provide connection between the adjacent high-frequency circuit substrates with a low electrical loss, keeping a high reliability as well as a simple construction.

As described above, in the connection structure for the high-frequency circuit substrate according to the fourth embodiment, the reinforcing substrate is composed of an upper reinforcing substrate and a lower reinforcing substrate, which sandwich and support via an anisotropic conductive film the upper base of the portion molded in the trapezoid of the high-frequency transmission line lead frame and a plurality of GND electrode lead frames, and a high-frequency transmission line wiring pattern is formed on a substrate surface of the upper reinforcing substrate and the lower reinforcing substrate at a portion opposite to the upper base of the high-frequency transmission line lead frame; and a GND wiring pattern is formed on a substrate surface in a region electrically separated from the high-frequency transmission line wiring pattern at the upper reinforcing substrate and the lower reinforcing substrate, as well as the GND wiring patterns, which are formed at the upper reinforcing substrate and the lower reinforcing substrate are in an electrical connection via a through hole. Consequently, it comes to be possible to confine the electromagnetic field in an internal part of the square-shaped coaxial line (that is, an internal part of the upper reinforcing substrate and lower reinforcing substrate) thereby enabling reduction in unwanted radiation.

As a result, it becomes possible to conduct connection between the high-frequency circuit substrates disposed in opposition in such a manner as to demonstrate a low electrical loss and excellence in workability and productivity while maintaining a high reliability.

While the presently preferred embodiments of the present invention have been shown and described.

It is to be understood that these disclosures are for the purpose of illustration and that various changes and modifications may be made without departing from the scope of the invention as set forth in the appended claims.

What is claimed is:

1. A connection structure for a high-frequency circuit substrate electrically connecting a first high-frequency circuit substrate at which a first high-frequency transmission line is formed to an end on a substrate surface, and a first GND electrode is formed on both sides of said first high-frequency transmission line to a second high-frequency circuit substrate at which a second high-frequency transmission line is formed to an end on a substrate surface, and a second GND electrode is formed on both sides of said second high-frequency transmission line, as well as which is located coplanar with said first high-frequency circuit substrate;

the connection structure for the high-frequency circuit substrate comprising:

a high-frequency transmission line lead frame providing a connection between an end portion of said first high-frequency transmission line formed on said first high-frequency circuit substrate and an end portion of said second high-frequency transmission line formed on said second high-frequency circuit substrate;

a plurality of GND electrode lead frames that are disposed in parallel to said high-frequency transmission line lead frame on both sides of said high-frequency transmission line lead frame, as well as provides a connection between said first GND electrode of said first high-frequency circuit substrate and said second GND electrode of said second high-frequency circuit substrate; and a reinforcing substrate integrally securing said high-frequency transmission line lead frame and a plurality of said GND electrode lead frames.

2. The connection structure for the high-frequency circuit substrate according to claim 1, wherein said high-frequency transmission line lead frame and a plurality of said GND electrode lead frames are made of a metallic material having a predetermined resilience, molded in a trapezoid at a central portion, as well as integrally secured to said reinforcing substrate at an upper base of said portion molded in the trapezoid.

3. The connection structure for the high-frequency circuit substrate according to claim 1, wherein said high-frequency transmission line lead frame and a plurality of said GND electrode lead frames are made of a metallic material having a predetermined resilience, and an arch part is molded at a central portion; and wherein said reinforcing substrate is provided with an opening into which said arch part of each lead frame is inserted, and integrally secures and supports said high-frequency transmission line lead frame and a plurality of said GND electrode lead frames in a state in which said arch part of each lead frame is inserted into said opening.

4. The connection structure for the high-frequency circuit substrate according to claim 3, wherein said arch part of said high-frequency transmission line lead frame and a plurality of said GND electrode lead frames, which is inserted into said opening of said reinforcing substrate, possesses a predetermined dielectric constant, as well as potted with resin having a low dielectric loss.

5. The connection structure for the high-frequency circuit substrate according to claim 1, wherein a plurality of said GND electrode lead frames are disposed respectively on each side of said high-frequency transmission line lead frame.

6. The connection structure for the high-frequency circuit substrate according to claim 2, wherein a plurality of said GND electrode lead frames are disposed respectively on each side of said high-frequency transmission line lead frame.

7. The connection structure for the high-frequency circuit substrate according to claim 3, wherein a plurality of said GND electrode lead frames are disposed respectively on each side of said high-frequency transmission line lead frame.

8. The connection structure for the high-frequency circuit substrate according to claim 4, wherein a plurality of said GND electrode lead frames are disposed respectively on each side of said high-frequency transmission line lead frame.

9. The connection structure for the high-frequency circuit substrate according to claim 2, wherein said reinforcing substrate is composed of an upper reinforcing substrate and a lower reinforcing substrate, which sandwich and secure via an anisotropic conductive film the upper base of the portion molded in the trapezoid of said high-frequency transmission line lead frame and a plurality of said GND electrode lead frames, and a high frequency transmission line wiring pattern is formed on a substrate surface of said upper reinforcing substrate and said lower reinforcing substrate at a portion opposite to the upper base of said high-frequency transmission line lead frame; and wherein a GND wiring pattern is formed on a substrate surface in a region electrically separated from said high-frequency transmission line wiring pattern at said upper reinforcing substrate and said lower reinforcing substrate, as well as said GND wiring patterns, which are formed at said upper reinforcing substrate and said lower reinforcing substrate are in an electrical connection via a through hole.

10. The connection structure for the high-frequency circuit substrate according to claim 9, wherein a plurality of said GND electrode lead frames are disposed respectively on each side of said high-frequency transmission line lead frame.

11. A manufacturing method of the connection structure for the high-frequency circuit substrate as defined in claim 1 comprising the steps of:

molding a high-frequency transmission line lead frame and a plurality of GND electrode lead frames into a comb shape of end portions being common by press working with a metal plate having a predetermined resilience being used;

adjusting a location of the high-frequency transmission line lead frame and a plurality of GND electrode lead frames, which have been molded in a comb shape, at a predetermined position on the reinforcing substrate and securing them together;

molding into a predetermined configuration by press working the high-frequency transmission line lead frame and a plurality of GND electrode lead frames, which have been secured at said predetermined position on said reinforcing substrate; and cutting a remainder of the high-frequency transmission line lead frame and a plurality of GND electrode lead frames, which have been secured at a predetermined position on said reinforcing substrate and molded into a predetermined configuration by press working.

12. A manufacturing method of the connection structure for the high-frequency circuit substrate as defined in claim 3 comprising the steps of:

molding a high-frequency transmission line lead frame and a plurality of GND electrode lead frames into a comb shape of end portions being common by press working with a metal plate having a predetermined resilience being used;

forming an arch part at a central portion of the high frequency transmission line lead frame and a plurality of GND electrode lead frames, which have been molded in a comb shape;

adjusting a location of the high-frequency transmission line lead frame and a plurality of GND electrode lead frames, which have been formed in a comb shape of end portions being common, as well as at a central portion of which an arch part has been formed, at a predetermined position of the reinforcing substrate and securing them together; and cutting a remainder of the high-frequency transmission line lead frame and a plurality of GND electrode lead frames, which have been secured at a predetermined position of said reinforcing substrate.

13. A high-frequency circuit device comprising:

a first high-frequency circuit substrate, which is located on a metal base, at which a first high-frequency transmission line is formed to an end on a substrate surface, and a first GND electrode is formed on both sides of said first high-frequency transmission line;

a second high-frequency circuit substrate at which a second high-frequency transmission line is formed to an end on a substrate surface, and a second GND electrode is formed on both sides of said second high-frequency transmission line, as well as which is disposed opposite to said first high-frequency circuit substrate on said metal base; and the connection structure for the high-frequency circuit substrate according to claim 1.

* * * * *